(12) United States Patent
Alam et al.

(10) Patent No.: US 7,230,812 B2
(45) Date of Patent: Jun. 12, 2007

(54) PREDICTIVE APPLICATIONS FOR DEVICES WITH THIN DIELECTRIC REGIONS

(75) Inventors: Muhammad Ashraful Alam, West Lafayette, IN (US); Philip W. Mason, Allentown, PA (US); Robert Kent Smith, New Providence, NJ (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 10/930,544

(22) Filed: Aug. 30, 2004

(65) Prior Publication Data

US 2005/0111155 A1 May 26, 2005

Related U.S. Application Data

(60) Provisional application No. 60/524,341, filed on Nov. 21, 2003.

(51) Int. Cl.
*G01R 31/26* (2006.01)
*G06F 11/30* (2006.01)

(52) U.S. Cl. ............... 361/93.1; 324/766; 324/769; 702/187; 702/57; 702/182

(58) Field of Classification Search ............... 361/93.1; 324/766, 769; 702/187, 57, 182
See application file for complete search history.

(56) References Cited

U.S. PATENT DOCUMENTS 4,875,409 A * 10/1989 Condon et al. .......... 101/93.29
5,321,354 A * 6/1994 Ooshima et al. ............ 324/765
5,478,765 A * 12/1995 Kwong et al. .............. 438/762
6,188,234 B1 * 2/2001 Abadeer et al. ............ 324/766
6,583,641 B2 * 6/2003 Wang et al. ................ 324/765
6,633,177 B1 * 10/2003 Okada ........................ 324/765
6,649,931 B2 * 11/2003 Honma et al. ................ 257/48
6,724,214 B2 * 4/2004 Manna et al. .............. 324/766
6,806,720 B2 * 10/2004 Vollersten .................... 324/551
6,952,658 B2 * 10/2005 Greulich et al. ............ 702/185

OTHER PUBLICATIONS

Weir et al. "Gate oxide reliability projection to the sub-2 nm regime", Semiconductor Science and Technology 15, 2000, pp. 455-461.*
Mason, PW "Methodology for Accurate Assessment of Soft-Broken Gate Oxide. . . " Proc Internat'l Reliability Physics Sym 2004 p. 430.
Alam, MA "Physics of Soft Breakdown and Its Implilcations . . . "Proc of Internat'l Electron Device Meeting, San Francisco, CA Dec. 2002.

(Continued)

*Primary Examiner*—Brian Sircus
*Assistant Examiner*—Z Kitov

(57) ABSTRACT

It is possible to predict with acceptable accuracy the time to failure of a device having a thin gate dielectric in a field effect transistor. Such prediction is based on the realization that for such thin dielectric multiple dielectric breakdown occurs before device failure ensues and that measurement of the device quiescent current flow provides the information necessary for such prediction. The ability to make reliable prediction allows improvement of device design, manufacture, and use.

8 Claims, 1 Drawing Sheet

OTHER PUBLICATIONS

Alam, MA "Phenomenological Theory of Correlated Multiple Soft-Breakdown Events . . . " 41st Annual Internat'l Reliability Symp. 2003.

Alam, MA "Statistically Independent Soft Breakdowns Redefine Oxide Reliability Specs." Proc of Internat'l Electron Device Meeting, Dec. 2002.

Alam, MA "Uncorrelated Breakdown of Integrated Circuits." Nature, 420, Nov. 28, 2002, p. 378.

Alam, MA "The Physics of Soft-Breakdown and its Implications for Integrated Circuits." Agere Systems, Nov. 28, 2005, http://dynamo.ecn.purdue.edu/~alam/Tutorials/irps2003_tutorial_alam.pdf.

* cited by examiner

PREDICTIVE APPLICATIONS FOR DEVICES WITH THIN DIELECTRIC REGIONS

CROSS REFERENCES

This application claims priority to U.S. provisional application 60/524,341 filed Nov. 21, 2003 which is hereby incorporated by reference in its entirety.

TECHNICAL FIELD

This invention relates to devices having gate dielectrics and in particular devices with thin gate dielectrics.

BACKGROUND OF THE INVENTION

Field effect transistors (FETs) are present in a myriad of electronic devices such as integrated circuits (ICs). An FET includes a source, and a drain electrically connected by a channel. A gate dielectric overlies the channel and a gate electrode, in turn, overlies the dielectric. (A first structure overlies a second structure if the first is farther from the substrate upon which the device is built.) In operation, a voltage is applied to the gate electrode producing, in the absence of a short between the gate electrode and channel through the gate dielectric, a relatively strong electric field. This field causes a change in conduction characteristics of the channel by causing an inversion of dominant carrier type in this region. Accordingly, upon inversion, the current flow between the source and the drain is changed. Indeed, large changes in current flow are inducible by relatively small voltages applied to the gate.

It has been a consistent goal to reduce the size of electronic devices and thus reduce the size of individual FETs in, for example, an integrated circuit. However, as FETs are reduced in size, the dimensions of components including the thickness of the gate dielectric are concomitantly reduced. As the thickness of the gate oxide is reduced, it becomes more difficult to avoid gate dielectric breakdown (i.e. the formation of a current path between the gate electrode and the channel through the gate dielectric).

The occurrence of even a single breakdown of a thick gate dielectric typically produces catastrophic failure of the device due to large changes in the electrical conductivity between the gate and either the source, drain, or substrate resulting in the gating function being severely altered. (A thick gate dielectric in this context is one having an average thickness in the region overlying the channel between the source and drain of more than 50 Å.) Surprisingly, however, for thin gate dielectrics (average thickness of 50 Å or less) the occurrence of a single breakdown (i.e. the presence of a significant increase in the current between gate electrode and channel region at the operating gate voltage), indeed the occurrence of multiple breakdowns, is not generally catastrophic for nominal gate voltages. (See M. A. Alam et al., 2002 IEDM Tech. Digest, pp. 151–154) for a discussion of this phenomenon.) For thin gate dielectrics whether the gate dielectric comprises one, two, three, or more layers at typical gate operating voltages (e.g. less than 2.0 Volts), the presence of a current path through a thin gate dielectric without device failure is denominated soft breakdown. During soft breakdown, a small current flow (generally less than 100 µA) is present between the gate electrode and channel but the device still operates with acceptable electrical characteristics, i.e. the device is still useful for the application in which it is employed.

Nevertheless, as the number of breakdowns increases, in time, the device fails. This time depends on a variety of statistical phenomenon associated with the degradation of the gate dielectric. The ability to determine the average time to failure (and/or the associated statistical distribution) of a device of a particular design is extremely important. Devices that fail in operation in an unacceptably short time will obviously cause undesirable economic consequences. Additionally, even if devices of a specific design on average do not fail prematurely, the unanticipated failure of an individual device might well cause unacceptable results for the user.

In an attempt to determine average device lifetime, accelerated aging tests are generally employed. In such tests, conditions are employed that are substantially more severe than those for which the device is designed. For example, the gate operating voltage is significantly increased, e.g. from 1.2 Volts to 3.3 Volts, and the mean time to failure for a large sample of devices is measured. Alternatively, another accelerated aging test involves increasing the temperature from 125° C. (maximum operating temperature) to more than 150° C. Accelerated testing yields some information concerning reliability, but by itself yields no definitive information concerning the absolute failure time of an individual device. Indeed, over the years, semiconductor manufacturers have developed many extrapolation techniques for thick oxides to correlate the results obtained from accelerated testing to actual operating conditions, but these extrapolation techniques have not proved predictive of thin dielectric reliability. Accordingly an approach to determine the time dependence of operating electrical characteristics in a device with a thin gate dielectric would be quite useful.

SUMMARY OF THE INVENTION

It is possible for devices having thin gate dielectrics, e.g. gate oxides, as thin as 50 Å or thinner to determine within an acceptable margin of error not only the average time to failure for specific device characteristics, but also the statistical distributions of the time to failure for a group of devices of the same design, since unlike thick oxides, a single breakdown does not generally cause malfunction of devices with thin gate dielectrics. Such determination depends on utilizing a model for determining the soft-breakdown gate leakage in an IC device. This determination is advantageously made for a typical device with thin gate dielectric using the relation $$I_1 = I_0 (t/\eta)^\beta \qquad (1)$$

where $I_1$ is the total leakage current increase (from the gate electrode through the gate dielectric to ground) due to gate dielectric breakdown, $I_0$ is the leakage current associated with an individual breakdown of the gate dielectric, t is the time at which $I_1$ is measured, $\eta$ is the time to the first breakdown, and $\beta$ is the Weibull slope. (The Weibull slope is a well-known quantity and is described in texts such as "Reliability and Failure of Electronic Materials and Devices," by M. Ohring, Academic Press, New York, 1998, p. 193.) This leakage current increase is predictive of the time evolution of IC electrical characteristics. The parameters needed for equation (1) are obtainable from measuring a current flow (defined in this context as a breakdown dependent current flow) that changes with a soft breakdown event. (The measurement of a quantity from which a value for such current flow is derivable for purposes of the invention is considered the measurement of a breakdown dependent current flow). An example of such current flow is the quiescent current flow (often termed IDDQ) at the appropriate power supply pin of the IC. The quantity $I_1$ is obtained by subtracting the background (time, t=0) breakdown dependent current flow from such current flow measured at time t. The parameter β is determinable by graphing log($I_1$) versus log(t/η) as shown in FIG. 1. Specifically, the parameter β is determinable from the slope of the graph in FIG. 1. In addition the parameters η and $I_0$ are determinable by observing the time to first breakdown (the time of the first statistically significant increase in the breakdown dependent current) and the magnitude of the increased breakdown dependent current flow at such first breakdown.

For a particular device design, the level of leakage current that induces device failure is easily ascertainable. Thus the parameters from equation 1 based on the monitoring of total leakage current versus time, the time to failure of a specific device or average time to failure of a group of devices is predictable generally within a factor of 2 to 3. Alternatively, as is often the case for reliability purposes, the prediction of the time associated with the failure of a certain fraction of devices is useful. The statistical nature associated with the time to failure of discrete IC's is similarly based on the parameters of equation (1). (See P. W. Mason, et al., 2004 IRPS proc., pp. 430–434 which is hereby incorporated by reference in its entirety.)

The ability to foretell time to failure enables a variety of predictive applications. (A predictive application in the context of this invention is an action taken based on prediction of the time to failure of devices due to multiple soft-breakdown by measuring breakdown dependent current flow.) For example, an integrated circuit is provided with a portion of memory and suitable measurement circuitry so that IDDQ is measured as a function of time and stored in memory. The device then causes an associated display device to indicate a warning of approaching failure based on the stored information. (It is possible to determine η and β from the device stored data or it is possible to store these parameters in memory based on determinations made from other corresponding devices or test structures.)

Not only is it possible to foretell the future, but also, in essence to relive the past. For example, the IDDQ history of a device is readable from memory in the application previously discussed. From this history, it is possible to reconstruct the temperature and voltage history of the device by comparison with IDDQ histories of prototypical samples subjected to controlled temperatures, voltages, or other conditions. In the context of this invention, such resurrection of history is also considered a predictive application.

Another advantageous, predictive application is the design or manufacture of a device having characteristics such as the gate dielectric thickness that yields a predicted average time to failure that is sufficiently long for the particular intended use. (The predicted average time to failure is ascertained as discussed above from test structures or finished devices where a test structure in this context is an array of transistors having a dielectric composition and dielectric thickness the same as that for the device whose characteristics are to be predicted.) Alternatively the operating conditions of a device are employed based upon a prediction of time to failure as previously discussed. Generally it is possible to employ conditions chosen in this way that are meaningfully more favorable as being more economic than those chosen based on previous predictive approaches.

A further predictive application involves evaluating the reliability of a semiconductor device design having a thin dielectric subject to breakdown and thus to choose a design to exploit based on such evaluation. An additional predictive application involves deconvoluting the circuit impact of more than one degradation mechanism to appropriately design such circuit. For instance transistor parametric drift during operation impacts IC performance. To correctly deconvolve the simultaneous impact of transistor drift and multiple gate dielectric breakdowns and act accordingly requires the application of the invention.

Thus the present invention involves in one aspect the improvement of device operation and overall use by a predictive application.

DETAILED DESCRIPTION

Figure 1:
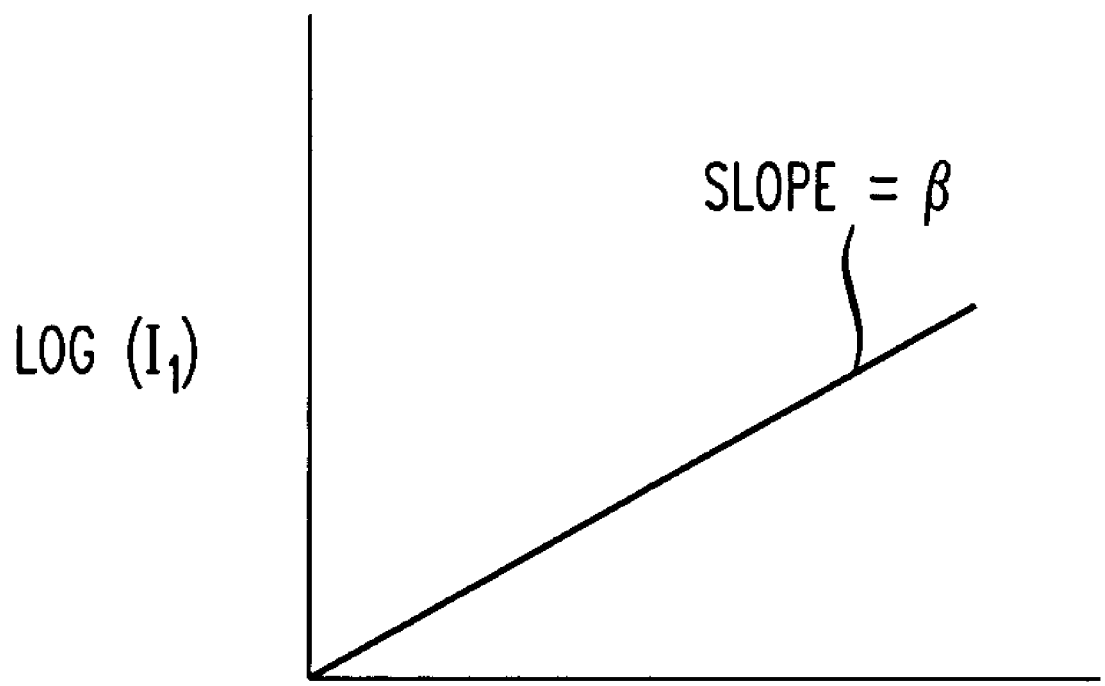
FIG. 1 is illustrative of device properties involved in the application.

As previously discussed, the invention involves the performing of a predictive application based on a determined time to failure of a device having a thin dielectric region, i.e., a region having a thickness of 50 Å or less. A predictive application is an action taken based on an unknown characteristic (e.g. time to failure or previous condition history that induced failure) determined from multiple soft breakdown considerations by measuring a breakdown dependent current flow such as IDDQ. The determined time to failure is 1) either that for an individual device, or 2) the average time to failure or the time distribution to failure of a multiplicity of devices. For both type 1 and type 2 predictions, an equation based on the entity $X=(t/\eta)^\beta$ is applicable. In particular, the type 1 prediction is based on the equation $$I_1 = I_0 X \quad (2)$$

and the type 2 prediction is based on the equation $$-\ln(1 - F_n) = X - \ln\left(\sum_{k=0}^{n-1} X^k / k!\right) \quad (3)$$

where $X = (t/\eta)^\beta$ where $F_n$ is the fraction of transistors that have undergone at least n soft breakdowns and where t, η, and β are as previously defined. Thus both a type 1 and type 2 predictions depend on measurement or calculation of X. The parameter X in an advantageous embodiment is measured by monitoring a breakdown dependent current flow such as the quiescent current flow (IDDQ) over time. (The IDDQ current is typically measurable at one of the power supply pins of a device such as an integrated circuit.) The breakdown dependent current flow is measured initially at time zero and then measured periodically or continuously generally until the device fails. (Failure of a device depends significantly on the application, and some examples of when this occurs are when either the on current of a transistor diminishes by 10% or the noise level exceeds 10 times the noise level at the first soft breakdown or when the power consumption is increased by 50%.) The time interval between measurements for periodic monitoring need not be of equal duration. Typically, data taken at logarithmic time intervals (e.g. 1, 10, 100, seconds and continuing) provide suitable data over the time interval from initiation of measurement to failure. However, until the first breakdown is observed, continuous measurement or measurement at intervals of 1 second or less are generally appropriate. The quantity $I_1$ at time t is obtained by subtracting the breakdown dependent current at time zero from the breakdown dependent current determined at time t. Thus $I_1$ for a series of times is accordingly obtained. Typically such monitoring is performed under accelerated conditions. In one advantageous approach accelerated conditions involves employing a voltage of between 50 and 150 percent greater than intended during normal operation.

The parameter β is determinable by graphing $\log(I_1)$ versus $\log(t/\eta)$ as shown in FIG. 1. In particular the parameter β is the slope of such graph. Similarly, the parameter η is the time at which the first statistically significant increase in breakdown dependent current was observed. (Although fluctuations in the current are possible due to noise, an increase in breakdown dependent current associated with the first breakdown is an increase that will depend significantly on a number of factors, including, but not limited to the voltage used, the gate dielectric thickness, and the circuitry electrically connected to the failed dielectric.) Although the means for determining the parameters involved in equations (2) and (3) need not necessarily be by this graph method, it has been found convenient and reliable.

Once the parameter X is ascertained, through the determination of η, and β, the equations (2) and (3) are useful in predicting type 1 and type 2 occurrences. Clearly such predictions are not precisely accurate for all conditions and for all devices. The margin of error associated with such predictions depends on a variety of factors, including sample size, operating conditions, and operating time. A suitable margin of error is generally attainable by employing nominal sample sizes, operating times, and/or operating conditions (if such conditions are adjustable in a particular application).

The number of soft breakdowns, n, that lead to failure as discussed above, is determined by setting a total acceptable leakage current and ascertaining with equations (2) and (3) the number of soft breakdowns that yields such current. Thus once the number of such breakdown events is set, equation (3) is useful for predicting the average time to failure or the distribution of failure times for an ensemble of devices having the determined η, β and $I_0$.

A variety of predictive applications in accordance with the invention are possible. In one exemplary embodiment a device such as an integrated circuit has a portion of memory and suitable measurement circuitry so that IDDQ is both measured and stored. As discussed, IDDQ is measured periodically or monitored continuously. In accordance with the type 1 or type 2 predictions, it is possible to provide a display device to indicate a warning of impending failure based as discussed above, on the parameters stored in memory. Alternatively, the average time to failure determined from, for example, IDDQ measurements is stored in memory and as the time to failure approaches, a warning display is appropriately activated. In a complementary predictive application, after device failure the conditions leading to failure are determined and action is taken to avoid further failure based on such information.

Similarly, in the evaluation of new devices or old devices for new applications the decision whether or not to respectively manufacture such device or initiate (or recommend the initiation of) such new use depends on the longevity of such device in an intended use. Thus another predictive application in accordance with the invention is the use, recommendation of use, or manufacture of a device based on a prediction of longevity or reliability. This category of predictive applications encompasses action based on the usefulness of a device under specific operating conditions; having specific structural compositional, and/or electrical designs; and the design itself of a device including for example, choice of material composition, circuitry, and/or structure of such device.

Although this description has been in terms of exemplary predictive applications, the invention is not so limited. A predictive application generically involves an action taken based on prediction of time to failure due to multiple soft breakdown events from breakdown dependent current measurement.

We claim:

1. A process for taking an action on an electronic device comprising a field effect transistor with a gate dielectric of thickness 50 Å or less, said process comprising the steps of performing a predictive application, wherein said predictive application comprises taking an action predicated on a prediction of the time to failure due to soft-breakdown of said device dependent on measurement of a breakdown dependent current.

2. The process of claim 1 wherein said predictive application comprises providing an expedient that displays a warning of impending failure of said electronic device based on said measurement.

3. The process of claim 2 wherein said measurement is made on a test structure.

4. The process of claim 1 wherein said predictive application comprises establishing characteristics of the structures of said electronic device.

5. The process of claim 1 wherein said measurement is employed to determine η and β where η is the time to first breakdown of said gate dielectric and β is the Weibull slope.

6. The process of claim 1 wherein said breakdown dependent current comprises the quiescent current.

7. A process for taking an action on an electronic device comprising an integrated circuit having field effects transistors such that said transistors have a gate dielectric of thickness 50 Å or less, said process comprising the steps of performing a predicted application, wherein said predicted application comprises taking an action predicated on a prediction of the time to failure of said device dependent on measurement of a breakdown dependent current for said transistors of said integrated circuit.

8. A process for determining conditions to which an electronic device has been subjected, said device comprising a field effect transistor with a gate dielectric of thickness 50 Å or less, said process comprising the steps of taking measurements of multiple soft breakdown dependent current and employing said measurements to determine said conditions.

* * * * *